United States Patent
Jin et al.

Patent Number: 6,154,471
Date of Patent: Nov. 28, 2000

[54] MAGNETICALLY TUNABLE AND LATCHABLE BROAD-RANGE SEMICONDUCTOR LASER

[75] Inventors: Sungho Jin, Millington; Hareesh Mavoori, Berkeley Heights, both of N.J.

[73] Assignee: Lucent Technologies Inc., Murray Hill, N.J.

[21] Appl. No.: 09/255,582

[22] Filed: Feb. 22, 1999

[51] Int. Cl.⁷ .................................................. H01S 3/10
[52] U.S. Cl. ............................. 372/20; 372/43; 372/45; 372/37; 372/98; 372/99; 372/108
[58] Field of Search ................... 372/20, 43, 45, 372/37, 98, 99, 108; 385/37

[56] References Cited

U.S. PATENT DOCUMENTS

| | | | |
|---|---|---|---|
| 4,748,632 | 5/1988 | Preston | 372/32 |
| 5,572,543 | 11/1996 | Heinemann et al. | 372/107 |
| 5,629,951 | 5/1997 | Chang-Hasnain et al. | 372/20 |
| 5,781,677 | 7/1998 | Jin et al. | 385/37 |
| 5,812,711 | 9/1998 | Glass et al. | 385/37 |
| 5,999,546 | 12/1999 | Espindola et al. | 372/20 |

FOREIGN PATENT DOCUMENTS

| | | |
|---|---|---|
| 1388327 | 3/1975 | United Kingdom . |
| WO9513638 | 5/1995 | WIPO . |

OTHER PUBLICATIONS

J.F. Ready, *Industrial Applications of Lasers*, 2$^{nd}$ Ed., Academic Press (1997).

F. J. Duarte, *Tunable Lasers Handbook*, Academic Press (1995).

M. Y. Li et al., *Electronics Lett.*, vol. 33, No. 12, 1051 (1997).

M. Y. Li et al., *IEEE Photonics Tech. Lett.*, vol. 10, No. 1, 18 (1998).

F. Sugihow et al., "Low threshold continuously tunable vertical cavity surface emitting lasers with 19.1 nm wavelength range", *Applied Physics Letters*, vol. 70, No. 5, 547 (1997).

W. L. Fang, "Design of bulk micromachined suspensions", *J. Micromechanics & Microengineering*. vol. 8, No. 4, 263 (1998).

Tayebati et al., "Microelectromechanical tuneable filters with 0.47 nm linewidth and 70 nm tuning range", *Electronics Lett.*, vol. 34, No. 1, 74 (1998).

Christenson et al., "Long–Wavelength Resonant Vertical––Cavity LED/Photodetector with a 75–nm Tuning Range", *IEEE Photonics Tech. Letts.*, vol. 9, No. 6, 725 (1997).

M. C. Larson et al., "Wide and continuous wavelength tuning in a vertical–cavity surface–emitting laser using a micromachined deformable–membrane mirror", *Appl. Phys. Lett.*, vol. 68, No. 7, 891 (1998).

M. H. MacDougal et al., "Wide–bandwidth distributed Bragg reflectors using oxide/GaAs multilayers", *Electron Lett.*, vol. 30, No. 14, 1147 (1994).

*Primary Examiner*—Leon Scott, Jr.
*Attorney, Agent, or Firm*—Scott J. Rittman

[57] ABSTRACT

The invention provides a device with an improved tunable laser structure, the structure useful with surface emitting lasers and capable of exhibiting desirable latchability. The tunable laser of the invention contains a laser structure having a lower reflector, an active laser region, and an upper reflector. The upper reflector contains a non-moveable reflector portion located adjacent the active laser region and a moveable reflector portion located a spaced distance from the non-moveable reflector portion. A magnetic material is located either on a surface of the moveable reflector portion or on a surface in contact with the moveable reflector portion, and a programmable magnet is located near the magnetic material, the magnet capable of inducing controlled movement of the magnetic material. This movement in turn induces movement of the moveable reflector portion such that the spaced distance between the moveable reflector portion and the non-moveable reflector portion is capable of being adjusted. By adjusting this spaced distance (i.e., the air gap between the moveable and non-moveable reflector portions), the phase of reflection and thus the laser output wavelength is controlled.

24 Claims, 2 Drawing Sheets

MAGNETICALLY TUNABLE AND LATCHABLE BROAD-RANGE SEMICONDUCTOR LASER

BACKGROUND OF THE INVENTION

1. Field of the Invention

The invention relates to tunable lasers, in particular, tunable semiconductor lasers.

2. Discussion of the Related Art

Tunable laser sources are useful in a variety of fields, including telecommunications, medicine, material diagnostics, spectroscopy, isotope separation and remote sensing. In applications such as optical sensors, as well as dense wavelength-division-multiplexed (DWDM) optical communication systems, which are growing in importance due to their ability to transmit large amounts of data, there is an increasing demand for laser sources capable of being tuned and/or chirped over a relatively wide range of wavelengths. Such tunable lasers offer the potential for substantially increasing the transmission capacity of multi-wavelength optical networks by providing different wavelengths on demand, as well as the potential for improving network reliability by serving as backups for sets of fixed-frequency lasers.

Several types of lasers capable of tuning are currently in use. (See, e.g., J. F. Ready, *Industrial Applications of Lasers* $2^{nd}$ *Ed.*, Academic Press (1997); and *Tunable Lasers Handbook*, F. J. Duarte, ed., Academic Press (1995).) These lasers include dye lasers, semiconductor lasers, optical parametric oscillators (OPOs), and free electron lasers (FELs). Of these, semiconductor lasers offer numerous advantages. Dye lasers and OPOs require pump lasers in order to operate, while the FELs are relatively large and very expensive. The Group III-V semiconductor lasers, which are useful in the red and near infrared region of the optical spectrum, do not have these drawbacks. In addition, semiconductor lasers have relatively high efficiency, small size, low weight, low power consumption, and the capability to be driven by low-voltage power supplies. Major applications of semiconductor lasers include light sources for magneto-optic data storage, compact disc players, printers, and optical fiber telecommunications.

Commercially-used $Al_xGa_{1-x}As$ and $In_xGa_{1-x}As_yP_{1-y}$ semiconductor lasers are conventionally tuned by varying temperature and operating current. However, these tuning techniques are relatively limited in attainable tuning range and thus do not fully exploit the available semiconductor gain bandwidth. In addition, mode hopping tends to create difficulties in reaching a specified wavelength, and the tuning may therefore be discontinuous. To achieve greater tunability across a wide gain bandwidth of a semiconductor medium, external cavity lasers (ECLs) have been employed. A tunable ECL contains an optical gain medium (i.e., a laser semiconductor diode with antireflection coatings on one or both facets), optics for coupling the output of the gain-medium waveguide to the free-space mode of the external cavity, one or more wavelength-selective filters, and one or more mirrors for defining an external feedback path. Various methods of delineating the laser optical resonance cavity are available. They include reflective optics such as prisms, gratings and other dichromic filters - which are narrow-band reflectors, and reflective coatings and dielectric mirrors which are capable of acting as broadband reflectors. Tuning of an ECL is achieved by either altering the characteristic reflection wavelength of the end reflectors (which in turn determines the resonating wavelength inside the cavity), or by changing the length of the laser cavity itself. To reduce mode hopping the wavelengths of the end reflectors and of the laser cavity resonance are advantageously changed proportionately. This proportionate change is a relatively difficult task, however, and generally involves sophisticated, and expensive, feedback mechanisms. In addition, external cavity lasers generally have lower output power and are typically bulkier than other semiconductor lasers. There has also been recent interest in the development of surface emitting laser diodes, in which the light emerges from the surface of the chip rather than from the edge. This feature allows devices to be packed densely on a semiconductor wafer, with two-dimensional arrays fabricated relatively easily. In some surface emitting laser diodes, the laser cavity is vertical, i.e., perpendicular to the plane of the p-n junction, and such devices are referred to as vertical cavity surface emitting lasers (VCSELs). If VCSELs are able to be made tunable over a broad-range of wavelengths, interest would be even more substantial.

A variety of general techniques exist for tuning such lasers, e.g., by changing the semiconductor energy bands, the dimensions of the laser cavity, or the properties of the reflectors. These techniques include thermal tuning, piezo-electric tuning, electrostatic tuning, and magnetostrictive tuning. Thermal tuning tends to be undesirably slow due to the time required for heat conduction and equilibration, it requires the continuous supply of power to maintain the desired temperature, and it has a limited tuning range because of potential damage to sensitive device components at high temperatures. Piezoelectric actuation, in addition to having a limited tuning range due to intrinsic material limitations, also requires the continuous application of high voltages to maintain the wavelength shift. Electrostatic tuning is widely used in miniature devices employing MEMS (microelectromechanical machine systems) technology (see, e.g., M. Y. Li et al., *Electron Lett.*, Vol. 33, No. 12, 1051 (1997); and M. Y. Li et al., *Photonics Tech. Lett.*, Vol. 10, No. 1, 18 (1998)). Such electrostatic tuning, however, is susceptible to drifts due to accumulation or leakage of electric charge, and also requires the continuous application of relatively high voltages to maintain the state of the device. Magnetostrictive tuning tends to require high magnetic fields to achieve usable strain levels and is also generally non-latchable (i.e., power must be sustained after switching).

Improved tunable laser devices are therefore desired, advantageously a semiconductor laser that is tunable over a relatively large range of the gain bandwidth of the optical cavity medium, and that exhibits latchability.

SUMMARY OF THE INVENTION

The invention provides a device with an improved tunable laser structure, the structure particularly useful with surface emitting lasers and capable of exhibiting desirable latchability. The latchability and improved tunability is provided by magnetic attraction or repulsion between a fixed, programmable magnet and magnetic material in contact with a reflector of a laser structure. Specifically, the tunable laser of the invention, as reflected in FIG. 1, contains a laser structure having a lower reflector (16), an active laser region (12), and an upper reflector (14). The upper reflector contains a non-moveable reflector portion located adjacent the active laser region and a moveable reflector portion located a spaced distance (20) from the non-moveable reflector portion. The moveable reflector portion is generally supported by a micro-scale cantilever structure (18) or a similar hinged or pivoted structure. A magnetic material (22) is located either on a surface of the moveable reflector portion or on a surface in contact with the moveable reflector portion. A programmable magnet (24) is located near the magnetic material, the magnet capable of inducing controlled movement of the magnetic material. This movement in turn induces movement of the moveable reflector portion such that the spaced distance between the moveable reflector portion and the non-moveable reflector portion is capable of being adjusted. By adjusting this spaced distance (i.e., the air gap between the moveable and non-moveable reflector portions), the phase of reflection and thus the laser output wavelength is able to be controlled.

The invention's use of magnetic force to adjust the output of the laser active region provides several advantages over conventional tuning processes. For example, unlike thermal tuning, the magnetic force is relatively fast, is latchable, and does not create the potential for damage to device components. And unlike piezoelectric actuation, intrinsic material limitations are substantially negligible, and the magnetic force-induced movement is latchable. The drifts encountered with electrostatic tuning are avoided in the invention, and, again, constant voltage is not always required. Finally, the high magnetic fields and typical non-latchability of magnetostrictive tuning are also avoided.

DETAILED DESCRIPTION OF THE INVENTION

The tuning mechanism that offers the largest continuous tuning range for a laser is the approach of mechanically changing the effective length of a Fabry-Perot tuning cavity. (See, e.g., F. Sugihwo et al., "Low threshold continuously tunable vertical cavity surface emitting lasers with 19.1 nm wavelength range", *Applied Physics Letters*, Vol. 70, No. 5, 547 (1997), the disclosure of which is hereby incorporated by reference.) This mechanical adjustment is generally implemented in practice by incorporating and electrostatically displacing micromechanical structures such as cantilevers or pivoted or hinged supports for one or both reflectors of a Fabry-Perot cavity. The invention involves a novel magnetic-force approach for tuning a laser using such micromechanical structures, the invention thereby being less susceptible to drift than electrostatic tuning and having the ability to maintain a shifted state without the need for sustained power, i.e., latchability.

Figure 1:
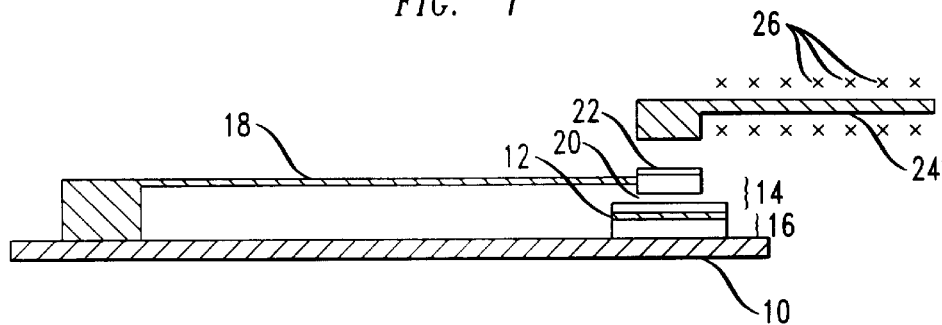
FIG. 1 illustrates an embodiment of a tunable laser device according to the invention.

FIG. 1 illustrates one example of a tunable laser device according to the invention. The device contains a substrate 10 supporting a laser structure that contains an active laser region 12, and upper and lower reflectors 14, 16. (Upper and lower are used for descriptive purposes only, and are not intended to limit the invention to a particular geometrical arrangement.) A portion of the upper reflector 14 is movable (a movable reflector portion) due to attachment to a cantilever structure 18, this portion defining an adjustable gap 20—typically by being located across the gap from the rest of the upper reflector (a non-moveable reflector portion). Magnetic material 22 is deposited as a thin or thick film (with buffer layers, if desired) or is bonded to the movable part of the upper reflector 14, at any location thereon, by any conventional technique. The magnetic material 22 is at any location, advantageously such that it does not obstruct the light path. A stationary, programmable magnet 24 is placed close to the magnetic material 22 to provide a magnetic force of varying magnitude, depending on the applied magnetic field. To allow an uninterrupted light path for the output from the active laser region 12, it is possible to provide windows or holes in the magnetic material 22, in the programmable magnet 24, and/or in any supporting structures. The magnetic force is generally attractive if a soft magnetic material is used, but is also capable of being repulsive if a hard magnetic material, such as Nd—Fe—B or Sm—Co, is used. One or more electromagnets (solenoids) 26 are disposed adjacent to the magnet 24 for providing a sufficient magnetic field to change the remnant magnetization in the programmable magnet 24. In operation, the programmable magnet 24 attracts or repels the magnetic material 22 with a force determined by the remnant magnetization in the programmable magnet 24, which in turn is controlled by the applied pulse field from the solenoid 26. Changes in the magnetic force between the magnetic material 22 on the cantilever and the pole of the stationary, programmable magnet 24 cause the cantilever 18 to deflect, thereby changing the gap 20 spacing. This change in the gap 20 spacing in turn changes the phase of the reflection from the air-cantilever interface, which alters the Fabry-Perot wavelength of the structure, leading to selective wavelength tuning of the laser output. It is also possible to tune both reflectors according to the invention. In addition, it is possible for the magnetic material on the moveable portion of a reflector to be programmable (using additional solenoid control), and such a configuration would be desirable to improve latchability.

Figure 2:
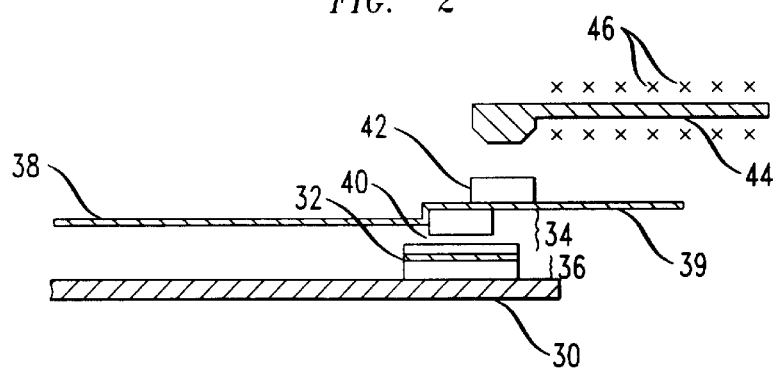
FIG. 2 illustrates another embodiment of a tunable laser device according to the invention.

It is possible for the magnetic material to be located directly on the surface of the moveable reflector portion, or to be located on a surface that is in contact with the moveable reflector portion (meaning that movement of the magnetic material induces movement of the moveable reflector portion). For example, as reflected in FIG. 2, it is possible to bond or deposit a foil of magnetic material 42 to an extension 39, e.g., to increase the available bonding area. It is possible for such an extension to be separate from or a part of a cantilever or similar structure. As in FIG. 1, the device of FIG. 2 further contains a supporting substrate 30, a laser structure having an active region 32, upper and lower reflectors 34, 36 (the upper reflector 34 having moveable and non-moveable portions separated by a gap 40), a stationary programmable magnet 44, and solenoids 46.

The magnetic material is any suitable material exhibiting the desired soft-magnetic, permanent-magnetic, or semi-hard programmable magnetic properties, depending on the particular application. Examples include Fe, Ni, and Co, high-permeability materials like permalloy (80Ni—20Fe), or high-coercivity materials like Nd—Fe—B or Sm—Co. It is also possible to use optically transparent materials such as certain types of garnet crystals.

The cantilever is made of any suitable material that exhibits the requisite spring-like properties. The cantilever is advantageously made of silicon and is of any suitable shape, e.g., circular, square, or rectangular cross-section. The dimensions and shape of the cantilever are chosen to achieve a desired stiffness which determines the amount of deflection for a given strength of magnetic field. Other suitable structures, e.g., hinged or pivoted structures, which provide the desired adjustment in the air gap are also possible. Lithographic techniques to fabricate such micromechanical structures are known, and typically involve formation of sacrificial layers which are later etched away to leave the cantilever or other free-standing structure. (See, e.g., W. L. Fang, *J. Micromechanics & Microengineering*, Vol. 8, No. 4, 263 (1998); and Tayelati et al., *Electronics Lett.*, Vol. 34, No. 1, 74 (1998).)

The invention is particularly useful with top- or bottom-emitting lasers, particularly vertical cavity surface emitting lasers. The active laser region is generally based on Group III-V semiconductor compounds such as $Al_{1-x}Ga_xAs$ (for 780–880 nm lasers), $In_{1-x}Ga_xAs_{1-y}P_y$ $x(for$ 1150–1650 nm lasers), $Al_xGa_yIn_{1-x-y}P$ (for 630–680 nm lasers) and $In_{1-x}Ga_xAs$ (for 980 nm lasers), although any suitable lasing material is capable of being used. Semiconductor laser material is generally grown in thin layers, typically a few micrometers thick, on a substrate by carefully controlled epitaxial growth techniques, such as molecular beam epitaxy or vapor phase epitaxy. Such growth techniques allow deposition of single crystalline layers with high perfection and specified composition.

Advantageously, the active region contains quantum wells. Quantum well laser structures offer lower threshold currents and higher output power than devices without quantum wells. (See, e.g., J. F. Ready, supra.) As known in the art, a quantum well is a very thin layer of semiconductor material between two layers with larger bandgap values. An example is GaAs between AlGaAs layers. If the layer is thin enough, e.g., 20 nm or less, quantum mechanical properties of electrons are exhibited, these properties changing the energy level structure of the material. The properties of quantum well materials are thus different from those of bulk semiconductors of the same composition. Specifically, the properties of quantum well materials are affected by the confinement of carriers in the potential well defined by the larger-bandgap layers. This confinement increases the gain coefficient and reduces the threshold current for laser devices. It is possible for quantum well devices to incorporate a single quantum well or multiple quantum wells with a number of alternating thin layers of high- and low-bandgap material. A multiple quantum well structure is sometimes referred to as a superlattice.

The top and bottom reflectors are typically dielectric or semiconductor distributed Bragg reflectors (DBRs). Reflective coatings and dielectric mirrors are also capable of being used. Semiconductor DBRs offer several desirable attributes over dielectric reflectors, e.g., higher sensitivity (5 to 10 times) of the laser wavelength to changes in the air gap, therefore giving larger tuning ranges; ease, precision and reproducibility of manufacture because of the epitaxial techniques used; and predictable material and mechanical characteristics. (See, e.g., Christenson et al., *IEEE Photonics Tech. Lett.*, Vol. 9, 725 (1997); and M. C. Larson et al., *Appl. Phys. Lett.*, Vol. 68, 891 (1998).) In particular, large free spectral range (FSR) semiconductor DBRs have been reported in literature using layers of materials from the AlGaAs system with techniques such as thermal oxidation. (Free spectral range, as known in the art, is the wavelength separation between two Fabry-Perot modes of a laser. See, e.g., M. H. MacDougal et al., *Electron Lett.*, Vol. 30, 1147 (1994).)

The programmable magnet materials are any materials that provide suitable properties. Advantageously, the programmable magnet contains a material having magnetic properties capable of modification by a pulse magnetic field. Examples of suitable magnets include Fe—Cr—Co, Fe—Al—Ni—Co (Alnico), Cu—Ni—Fe (Cunife), Co—Fe—V (Vicalloy), low-coercivity rare earth cobalt (e.g., Sm—Co) or Nd—Fe—B magnets, and Ba-ferrite or Sr-ferrite magnets. The range of the coercivity for the programmable magnet is typically below 500 Oe and advantageously below 100 Oe for improving the ease of programming by re-magnetization using a solenoid pulse field. The coercivity is typically above 10 Oe and advantageously above 30 Oe for maintaining the stability of the remanent magnetization and also for maintaining stability against demagnetization caused by stray magnetic fields. For desirable latchability of magnetization when the field is removed, the programmable magnet advantageously exhibits a square magnetization hysteresis loop with a squareness ratio (remanent magnetization/saturation magnetization) of at least 0.85, advantageously at least 0.90, more advantageously at least 0.95. For improving the control, the loop is desirably skewed by at least 50% of $H_c$, for example, as described in U.S. patent applications Ser. Nos. 09/020206 (our reference Espindola 6-148-2-44) and 09/097549 (our reference Espindola 10-154-6-76), the disclosures of which are hereby incorporated by reference. Mechanically ductile and easily formable or machinable magnet alloys such as Fe—Cr—Co, Cu—Ni—Fe, Co—Fe—V are particularly desirable for shaping into a desired configuration, e.g., a rod. Stable permanent magnets with relatively high coercive forces (e.g., $H_c$>1000 Oe), such as Sm—Co or Nd—Fe—B tend to cause more difficulty in reprogramming the remanent magnetization using a low magnetic field.

The attainable tuning range in the tunable lasers of the invention is the free spectral range of the laser structure, as determined by its effective cavity length. It is possible to tune the output wavelength by a desired range, e.g., designs providing a total range of at least 20 nm, optionally at least 40 nm, are possible. Smaller ranges are also possible, however, and will be desirable in some cases, depending on the particular application.

Figure 3:
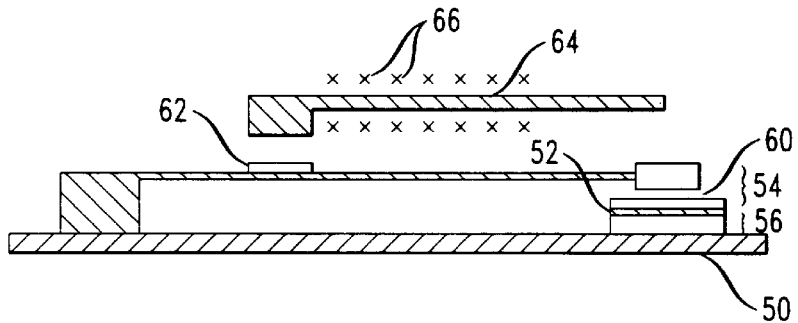
FIG. 3 illustrates a further embodiment of a tunable laser device according to the invention.

It is possible to arrange the magnetic material on the cantilever or other structure to attain desired results. For example, in FIG. 3, the magnetic material 62 is attached to the arm of the cantilever 58 at a location that is closer to the cantilever support. This gives larger changes in the gap 60 spacing for a given displacement of the magnetic material 62 by programmable magnet 64 and solenoids 66. As in the previous embodiments, the device of FIG. 3 further contains a supporting substrate 50, and a laser structure containing an active region 52 and upper and lower reflectors 54, 56.

Figure 4:
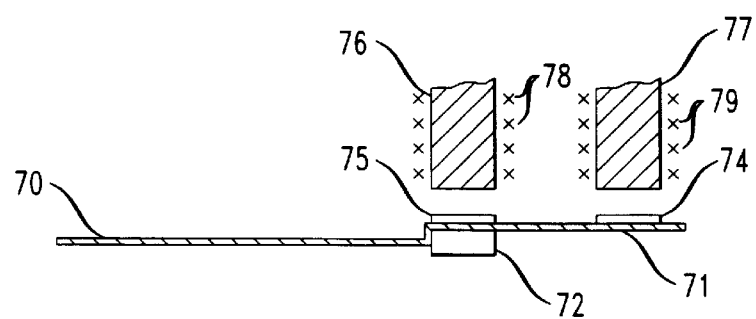
FIG. 4 illustrates an additional embodiment of a tunable laser according to the invention.

It is possible that tilting of the upper reflector due to the cantilever deflection could lead to losses detrimentally affecting the tuning range or laser performance. FIG. 4 shows an arrangement in which such tilt losses are reduced. Specifically, two independently programmable magnets 76 and 78, with separate sets of solenoids 78, 79 are used to reduce or avoid tilt. Varying amounts of magnetic force are applied to the magnetic material 74, 75 located on an extension 71 of the cantilever 70, the extension located on the movable portion 72 of an upper reflector, thereby creating a moment that corrects for the tilt. It is also possible to use more than two independently tunable magnets to provide greater control of tilt.

Figure 5:
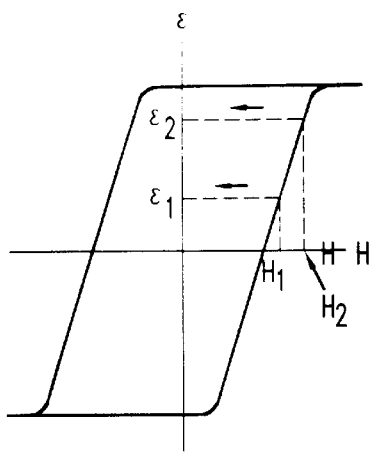
FIG. 5 illustrates the characteristics of a programmable magnet useful in the invention.

In the invention, it is possible to latch a particular wavelength. Specifically, after a pulse or short-duration current to the solenoid is applied for actuation, the movable magnetic material is latched at a certain position (determined by the equilibrium between the magnetic force and the stress in the cantilever structure) and electrical power no longer must be continuously supplied. Such latching is attained, in one embodiment, by using a programmable magnet having a skewed hysteresis loop, as discussed above. For example, the M-H loop of a Fe-28%Cr-7%Co alloy deformation-aged to yield a square M-H loop with Hc of 70 Oe, a dimension of 0.180" diameter and 4" length is skewed by ~60 Oe, producing a M-H loop reflected (approximately) in FIG. 5. For applied magnetic fields of $H_1$ and $H_2$, the corresponding magnetization is latchably retained after the field is removed, and hence the induced deflections, $\epsilon_1$ and $\epsilon_2$, are also latchably retained. Therefore, the device is able to be operated without continuous power. The latched movement, i.e., the movement provided after the applied field is removed, is at least 85% of the movement provided during application of a magnetic field, advantageously at least 90%, more advantageously at least 95%. To tune the device from such a latched state, the deflection is altered and re-latched by changing the magnetization in the programmable magnet. This alteration and re-latching is achieved, for example, by increasing the applied field or by demagnetizing and then re-magnetizing to a new field level. For magnetization of the programmable magnet using a solenoid, a pulse field (a pulse current in the solenoid) is conveniently used for high-speed, low-power operation of the devices. The desired duration or speed of the pulse field is typically in the range of $10$–$10^{-6}$ seconds, advantageously $10^{-1}$–$10^{-4}$ seconds. It is possible for the shape of the applied current pulse to be sinusoidal, rectangular, trapezoidal, triangular, or irregular. It is possible for the solenoid to be a single solenoid or to contain two or more segments with independent control.

Figure 6:
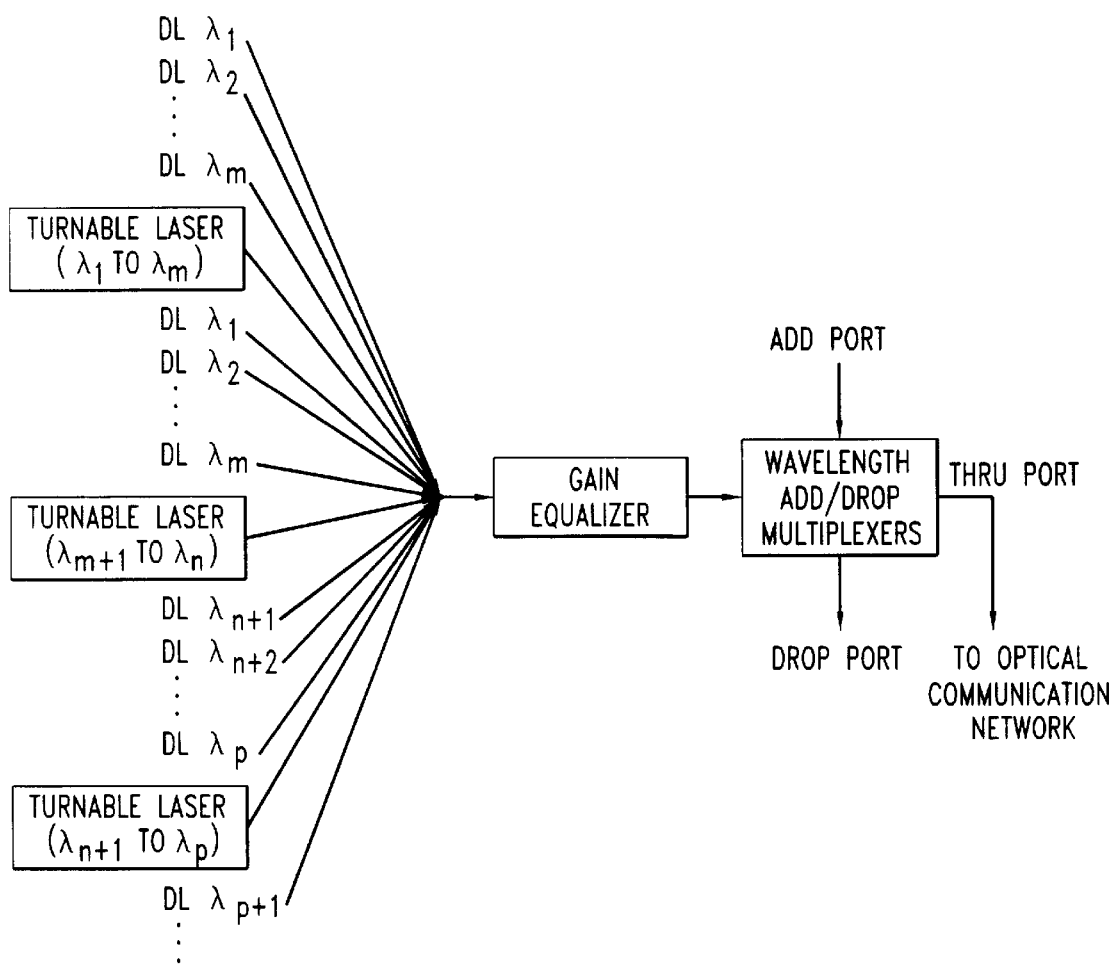
FIG. 6 illustrates the use of tunable laser devices of the invention in a wavelength division multiplexed optical network.

The tunable and optionally latchable laser devices of the invention are useful in a variety of application, including optical communication systems. For example, FIG. 6 shows a multi-wavelength laser source for a WDM optical network containing tunable laser sources of the invention. Each of the tunable lasers is capable of serving as a back-up source if any one of the discrete wavelength lasers (denoted by "DL") within an individual tunable laser's wavelength range fails, therefore improving network reliability. In addition, in times of network overload, it is possible for these tunable lasers to provide wavelengths on demand that are different from those currently being used, and thereby improve the information-carrying capacity and the hardware utilization of the network. The tunable laser devices of the invention are also capable of being used in a non-latching, continuously tuning mode if desired, e.g., scanning a range of laser wavelengths to monitor the operation of wavelength-specific devices (such as wavelength-channel add/drop modules, filters etc.) for applications such network management, diagnostics and troubleshooting. Such a result in achieved, for example, by replacing the programmable magnetic with a soft magnet to allow the continuous scanning. Such a variable laser source is also useful in diverse applications such as enhanced optical character recognition through laser scanners, optical fiber-based image display systems, and laser processing apparatus for surface treatment of materials and devices with varying surface optical characteristics, e.g. optical reflection or absorption.

Other embodiments of the invention will be apparent to those skilled in the art from consideration of the specification and practice of the invention disclosed herein.

What is claimed is:

1. A device comprising a tunable laser, the tunable laser comprising:

a laser structure comprising a lower reflector, an active laser region, and an upper reflector comprising a moveable reflector portion that defines an adjustable gap;

a magnetic material located on a surface selected from a surface of the moveable reflector portion and a surface in contact with the moveable reflector portion; and a programmable magnet capable of inducing controlled movement of the magnetic material, the movement of the magnetic material inducing movement of the moveable reflector portion such that the spaced distance between the moveable reflector portion and the non-moveable reflector portion is capable of being adjusted.

2. The device of claim 1, wherein the upper reflector further comprises a non-moveable reflector portion located adjacent the active laser region and located opposite the adjustable gap from the moveable reflector portion.

3. The device of claim 2, wherein adjustment of the adjustable gap between the moveable reflector portion and the non-moveable reflector portion controls an output wavelength of the laser structure.

4. The device of claim 1, wherein the laser structure comprises a surface emitting laser.

5. The device of claim 4, wherein the laser structure comprises a vertical cavity surface emitting laser.

6. The device of claim 1, wherein the active laser region comprises a Group III-IV compound semiconductor.

7. The device of claim 6, wherein the active laser region is selected from $Al_{1-x}Ga_xAs$, $In_{1-x}Ga_xAs_{1-y}P_y$, $Al_xGa_yIn_{1-x-y}P$, and $In_{1-x-y}Ga_xAs$.

8. The device of claim 1, further comprising at least one solenoid capable of applying a magnetic field to the programmable magnet.

9. The device of claim 1, wherein the programmable magnet is capable of providing latched movement of the moveable reflector portion.

10. The device of claim 9, wherein the latched movement is at least 85% of the movement provided during application of a magnetic field.

11. The device of claim 3, wherein the output wavelength of the laser structure is capable of being tuned over a range of at least 20 nm.

12. The device of claim 11, wherein the output wavelength of the laser structure is capable of being tuned over a range of at least 40 nm.

13. The device of claim 1, wherein the upper reflector and the lower reflector comprise reflective structures selected from distributed Bragg reflectors, dielectric mirrors, and reflective coatings.

14. The device of claim 1, wherein the active laser region comprises at least one quantum well layer.

15. The device of claim 1, wherein the magnetic material comprises at least one of Fe, Ni, Co, permalloy, Nd—Fe—B, and Sm—Co.

16. The device of claim 1, wherein the at least one programmable magnet exhibits a square magnization hysteresis loop with a squareness ratio of at least 0.85.

17. The device of claim 16, wherein the programmable magnet comprises at least one alloy selected from Fe—Cr—Co, Fe—Al—Ni—Co, Cu—Ni—Fe, Co—Fe—V, rare earth-cobalt, Nd—Fe—B, Ba-ferrite, and Sr-ferrite.

18. The device of claim 1, wherein the magnetic material is selected from soft, hard, or programmable magnetic materials.

19. The device of claim 1, wherein the moveable reflector portion is supported by a structure selected from a cantilever, a hinged structure, and a pivoted structure.

20. The device of claim 1, further comprising a second magnetic material located on a surface selected from a surface of the moveable reflector portion and a surface in contact with the moveable reflector portion, and a second programmable magnet capable of inducing controlled movement of the second magnetic material.

21. The device of claim 1, wherein the magnetic material is located directly on the moveable reflector portion.

22. The device of claim 1, wherein the magnetic material is located on an extension attached to the moveable reflector portion.

23. The device of claim 1, wherein the device is a sensor device.

24. The device of claim 1, wherein the device is a wavelength division multiplexing system.

* * * * *